United States Patent [19]
Ghanbari

[11] Patent Number: 5,982,100
[45] Date of Patent: Nov. 9, 1999

[54] INDUCTIVELY COUPLED PLASMA REACTOR

[75] Inventor: Ebrahim Ghanbari, West Nyack, N.Y.

[73] Assignee: Pars, Inc., West Nyack, N.Y.

[21] Appl. No.: 09/041,169

[22] Filed: Mar. 12, 1998

Related U.S. Application Data

[60] Provisional application No. 60/053,951, Jul. 28, 1997.

[51] Int. Cl.$^6$ ....................................... H01J 7/24
[52] U.S. Cl. ................................. 315/111.21; 315/111.51
[58] Field of Search .......................... 315/111.21, 111.41, 315/111.51

[56] References Cited

U.S. PATENT DOCUMENTS

| | | | |
|---|---|---|---|
| 3,873,884 | 3/1975 | Gabriel | 315/267 |
| 4,948,458 | 8/1990 | Ogle | 156/643 |
| 5,226,967 | 7/1993 | Chen et al. | 118/723 |
| 5,231,334 | 7/1993 | Paranjpe | 315/111.21 |
| 5,304,279 | 4/1994 | Coultas et al. | 156/345 |
| 5,556,521 | 9/1996 | Ghanbari | 204/192.32 |
| 5,619,103 | 4/1997 | Tobin et al. | 315/111.21 |
| 5,683,548 | 11/1997 | Hartig et al. | 156/643.1 |
| 5,710,486 | 1/1998 | Ye et al. | 315/111.51 |
| 5,711,850 | 1/1998 | Okumura et al. | 156/643.1 |

FOREIGN PATENT DOCUMENTS

| | | |
|---|---|---|
| 0379828A2 | 12/1989 | European Pat. Off. . |
| 2231197A | 3/1990 | United Kingdom . |

OTHER PUBLICATIONS

Plasma Sources Sci. Technol. 1 (1992), pp. 109–116, J. Hopwood, "Review of Inductively Coupled Plasmas for Plasma Processing".

Plasma Sources Sci. Technol. 5 (1996), pp. 166–172, J. Keller, "Inductive Plasmas for Plasma Processing".

*Primary Examiner*—Michael B Shingleton
*Attorney, Agent, or Firm*—Ohlandt, Greeley, Ruggiero & Perle

[57] ABSTRACT

A plasma reactor incorporating the invention includes a plasma chamber and one or more gas inlets for introducing an ionizable gas into the plasma chamber. A dielectric plate is positioned over an opening to the plasma chamber and above a support that holds a workpiece. An inductor is juxtapositioned to the dielectric plate and comprises multiple winding portions which evidence plural segments of increasing radii from a center of the inductor. Segments of lesser radii are arranged to reside further away from the dielectric plate than segments of greater radii, lending the inductor a truncated conical shape with respect to the dielectric plate. By modifying the pitch angle and/or radius of the plural segments, the field configuration within the chamber can be varied to accommodate different workpieces. Further, a conductive support is positioned between the dielectric plate and the plasma chamber and serves as a support for the dielectric plate, an electrostatic shield between the dielectric plate and the plasma chamber, and further provides channels for the introduction of one or more ionizable gases into the chamber.

9 Claims, 3 Drawing Sheets

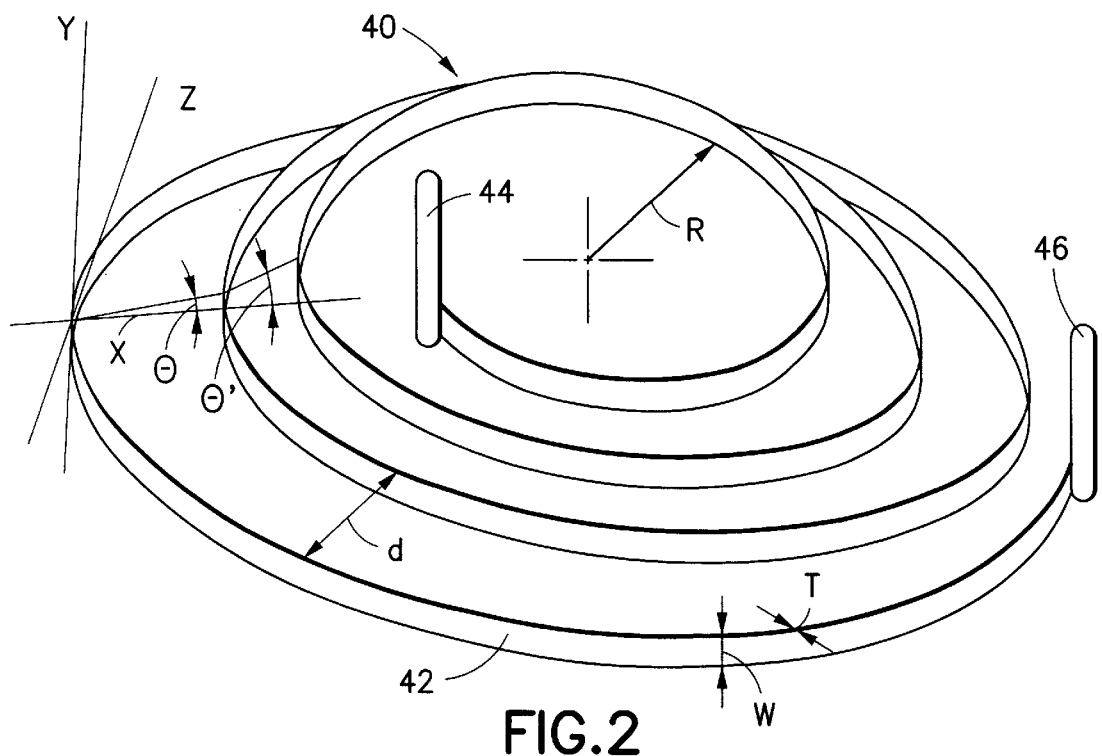
FIG. 2
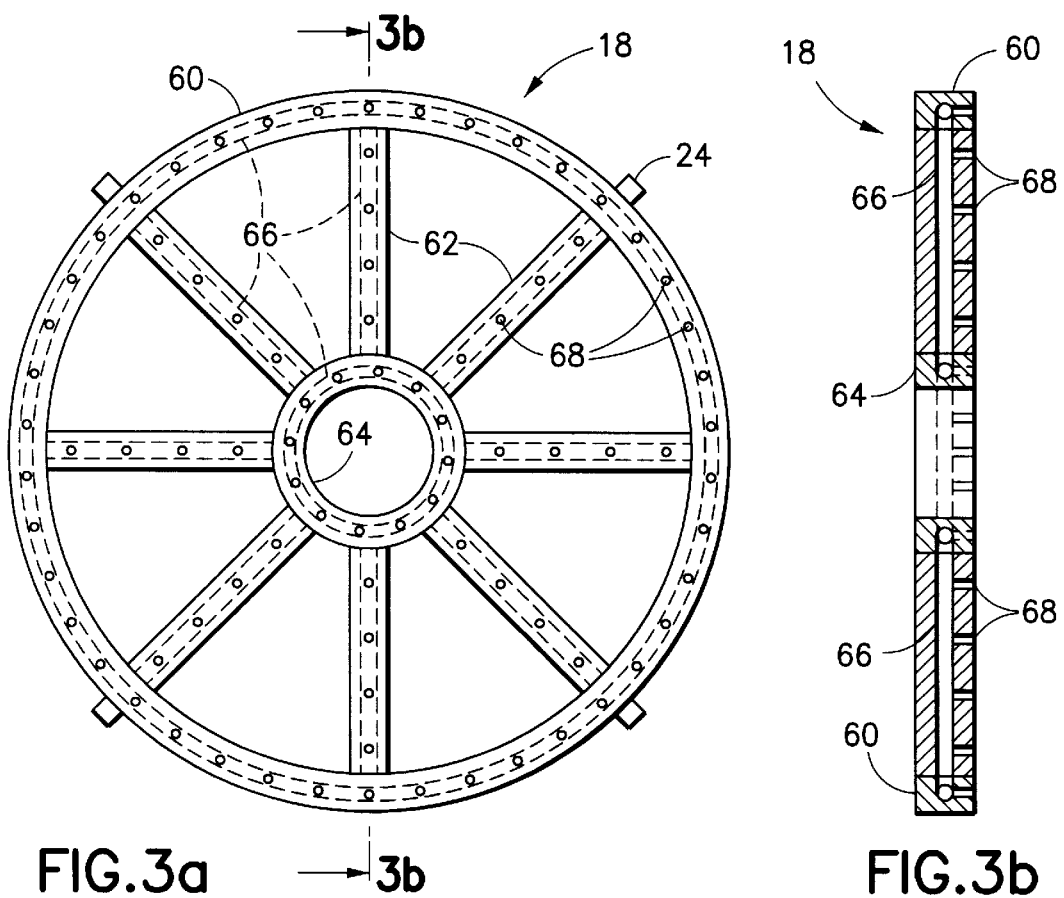
FIG. 3a
FIG. 3b

INDUCTIVELY COUPLED PLASMA REACTOR

This application claims priority from Provisional Application 60/053,951, filed Jul. 28, 1997 in the U.S. Patent & Trademark Office.

FIELD OF THE INVENTION

This invention relates to inductively coupled plasma reactors and, more particularly, to an inductively coupled plasma reactor which exhibits a non-planar inductor structure and a Faraday shield which (i) acts to reduce capacitive coupling into the plasma chamber of the reactor, (ii) provides gas distribution into the plasma chamber and (iii) further provides support for a dielectric access window.

BACKGROUND OF THE INVENTION

Inductively coupled plasma (ICP) reactors use an inductive circuit element that is placed adjacent to, or inside a discharge region in order to couple energy from an RF power source to an ionizable gas. The inductive circuit element is typically a helical or spiral-like antenna structure. In certain plasma reactor systems, additional electrical reactances are used to tune the inductor, such that an electrical resonance occurs at the RF driving frequency.

When an inductive coupling element is driven in the electrical resonance condition, high potentials tend to exist on the structure which lead to a capacitive coupling to the plasma discharge. Capacitively coupled plasmas are characterized by high voltages which cause ions to be accelerated across the plasma sheath to the walls, at high energy, and can cause sputtering and heating of the walls. The prior art has reduced capacitive coupling into plasma sheaths by utilization of encompassing Faraday shields that are slotted so as to enable penetration of the inductively created energy, while shorting out the capacitive coupling.

J. Hopwood in "Review of Inductively Coupled Plasmas for Plasma Processing", Plasma Sources Science & Technology, Volume 1, 1992, pages 109–116, provides a review of a number of plasma reactor structures that are used for ICP processing. Several reactor versions employ helical inductors that are wound around a plasma chamber and are separated therefrom by slotted Faraday shields. A further version uses a planar spiral coil which is placed on a quartz window and induces energy into the plasma chamber through the quartz window.

J. Keller in "Inductive Plasmas for Plasma Processing", Plasma Sources Science & Technology, Volume 5, 1996, pages 166–172, provides further details regarding ICP reactor structures. Keller indicates that non-uniformities present in inductively induced plasmas can be reduced by increasing the turn height or width of the inductor that is used to create the plasma. Further, Keller indicates that the distance between coil turns in the middle of the coil, or where the plasma density is at a maximum, can also be increased. He further indicates that the RF fields can be reduced by an increase in the thickness of the dielectric window through which the energy is coupled. Also, he indicates that the plasma can be radially confined by multi-pole magnetic cusps and that gas injection can be improved through use of a "showerhead" so as to reduce non-uniformities in the resulting plasma sheath.

U.S. Pat. No. 5,556,521 to the Applicant herein, describes a sputter etching apparatus wherein an inductor is placed on a dielectric plate and induces a plasma within a chamber positioned beneath the dielectric plate. A contoured pocket in the dielectric plate receives the inductor and enables the creation of a high density, uniform plasma proximate to a substrate located in the plasma chamber.

ICP reactors are utilized for deposition and etching of materials, principally in the semiconductor industry. For example, plasma enhanced chemical vapor deposition (PECVD) of dielectrics and metal thin films onto large area wafers comprise standard manufacturing processes in the semiconductor industry. Further, such reactors are employed for dry etching of dielectric and metal thin films. ICP reactors are also used for manufacture of thin film transistors on large area glass substrates (e.g., for use in flat panel displays). Likewise, such reactors are used to create patterned dielectric and metal thin films on large area glass substrates.

In all such applications, it is desirable that capacitive coupling between the inductor and the plasma be minimized. As the plasma is most intense in the vicinity of the inductor assembly, there is a large ion flux directed toward the inductor. These ions are accelerated by a large sheath potential and sputter the underlying surface of the dielectric plate or window through which the inductive energy is coupled. Such sputtering forms particulates which contaminate a wafer or substrate being processed.

Because current ICP reactors operate at low pressures, the dielectric window through which the inductive energy is coupled is required to exhibit a substantial thickness so as to resist fracture due to the differential pressure that is present thereacross.

It is therefore an object of this invention to provide an improved ICP reactor wherein the structure of the inductor is arranged to enable a field configuration to be induced in the reactor chamber so as to provide a substantially uniform plasma therein.

It is another object of this invention to provide an ICP reactor which is enabled to utilize a dielectric window of relatively thin cross-section that reduces attenuation seen by energy that is inductively coupled therethrough.

It is yet another object of this invention to provide an improved ICP reactor wherein an incorporated Faraday shield substantially reduces capacitive coupling into the reactor, provides gas distribution and dielectric window support.

SUMMARY OF THE INVENTION

A plasma reactor incorporating the invention includes a plasma chamber and one or more gas inlets for introducing an ionizable gas into the plasma chamber. A dielectric plate is positioned over an opening to the plasma chamber and above a support that holds a workpiece. An inductor is juxtapositioned to the dielectric plate and comprises multiple winding portions which evidence plural segments of increasing radii from a center of the inductor. Segments of lesser radii are arranged to reside further away from the dielectric plate than segments of greater radii, lending the inductor a truncated conical shape with respect to the dielectric plate. By modifying the pitch angle and/or radius of the plural segments, the field configuration within the chamber can be varied to accommodate different size and shape workpieces. Further, a conductive support is positioned between the dielectric plate and the plasma chamber and serves as a support for the dielectric plate, an electrostatic shield between the dielectric plate and the plasma chamber, and further provides channels for the introduction of one or more ionizable gases into the chamber.

BRIEF DESCRIPTION OF THE DRAWINGS

FIG. 2 is a schematic perspective view of an inductor which is incorporated into the ICP reactor of FIG. 1.

FIG. 3a illustrates a plan view of a support/Faraday shield/gas distributor that is utilized in the ICP reactor of FIG. 1.

FIG. 3b illustrates a side view of the support/Faraday shield/gas distributor of FIG. 3a.

DETAILED DESCRIPTION OF THE PREFERRED EMBODIMENT

Figure 1:
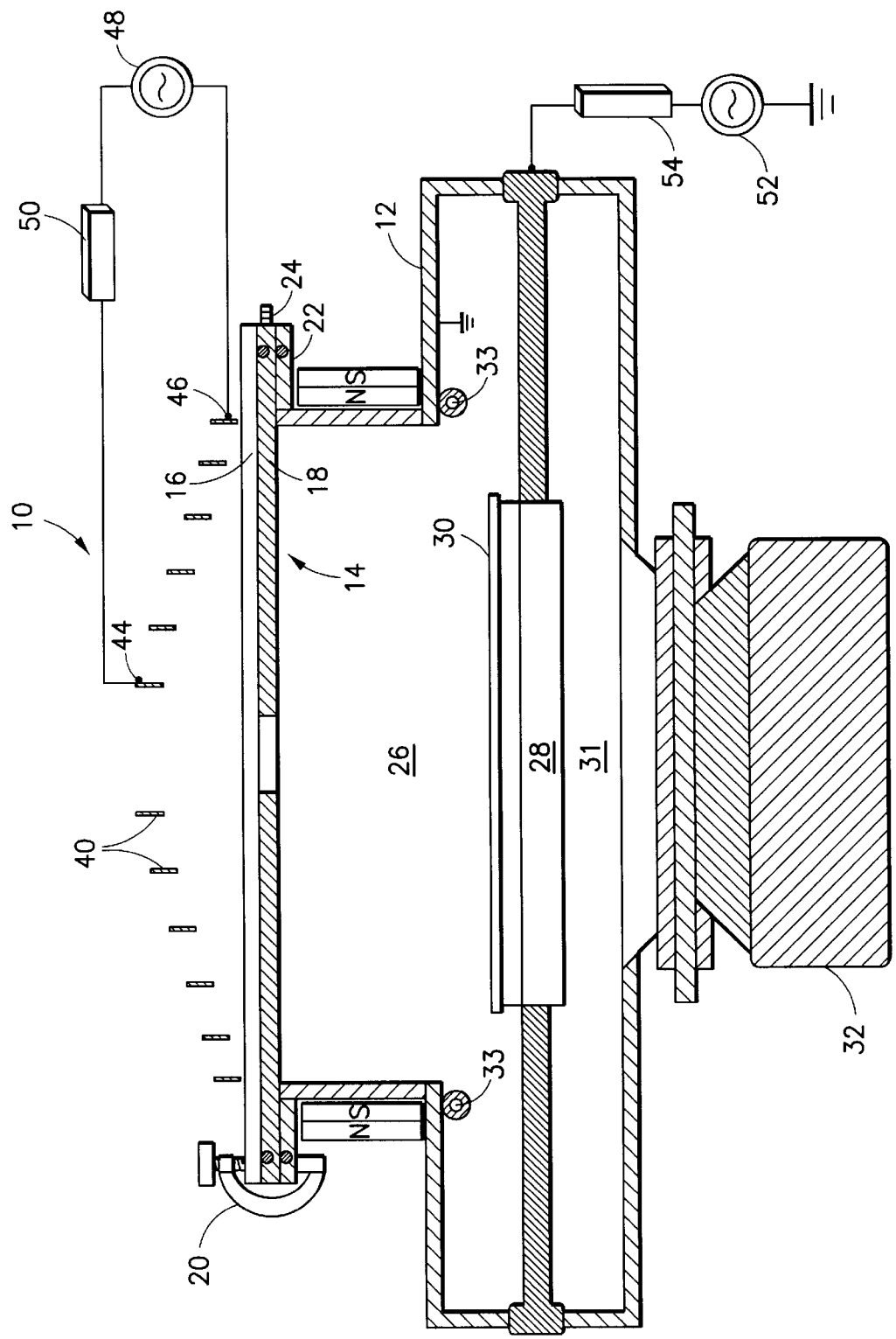
FIG. 1 is a schematic sectional view of an ICP reactor incorporating the invention hereof.

Referring now to FIG. 1, ICP reactor 10 includes a housing 12 having an aperture 14 which is sealed by a dielectric window 16 placed thereover. Positioned beneath dielectric window 16 is an electrostatic shield/multi-zone gas distributor/support 18 (hereafter referred to as "shield 18"). A series of clamps 20 (only 1 is shown) seals dielectric window 16 and shield 18 to a flange 22 of housing 12. One or more gas inlets 24 communicate with internal pathways (not shown in FIG. 1) within shield 18 and provide one or more gas feeds which are distributed throughout shield 18 and exit therefrom, via a plurality of orifices, into plasma chamber 26. The details of the structure of shield 18 will be described below with reference to FIGS. 3a, 3b and 3c.

A platen 28 is positioned within plasma chamber 26 and holds a workpiece 30 that is to be processed. Beneath the platen 28 is a lower chamber 31 which leads to a high vacuum pump 32 that is used to evacuate the internal regions of housing 12. Also positioned within plasma chamber 26 is an auxiliary gas ring 33 which is utilized for adding further ionizable gases in a region that is closer to workpiece 30.

Referring to FIGS. 1 and 2, in conjunction, a spiral inductor 40 of variable radius R is positioned over dielectric window 16 and takes the shape of a truncated cone, having a concave region opening downwardly towards dielectric window 16. Inductor 40 is preferably made from a strap of conductive metal whose width W is substantially larger than its thickness T. Conductive strap 42 is positioned over dielectric window 16 so that its thickness aspect T is oriented substantially parallel to the major upper surface of dielectric window 16. In such manner, the capacitance between conductive strap 42 and the internal regions of plasma chamber 26 are minimized.

Conductive strap 42 is arranged so that both the pitch distance d between adjacent windings and the pitch angle θ between windings can be varied so as to modify the field configuration within plasma chamber 26. The coordinate system shown in FIG. 2 places the XY plane in the uppermost surface of dielectric window 16 and the Z axis is orthogonal thereto. As can be seen, pitch angle θ between the two outermost windings is substantially different than pitch angle θ' between the second and third windings. Thus, by varying both pitch distance d and substrate pitch angles θ, θ', etc., the configuration of the induced field within plasma chamber 26 can be matched to the size and structure of workpiece 30. Accordingly, inductor 40 can be adjusted to produce a more uniform plasma within plasma chamber 26.

Returning to FIG. 1, a radio frequency (RF) source 48 is connected to RF connection studs 44 and 46. An impedance matching network 50 may be connected between RF source 48 and inductor 40. A further source of RF energy 52 may be connected through an impedance matching network 54 to platen 28.

FIGS. 3a and 3b, respectively, illustrate plan and side views of shield 18. Shield 18 takes the form of a wheel structure having a wheel section 60, a plurality of spokes 62 and a hub section 64. Each includes an internal channel 66 which communicates with a plurality of orifices 68. One or more gas inlets 24 provide a flow of an ionizable gas into channels 66, thereby enabling a shower of such gas to enter plasma chamber 26 via orifices 68.

Shield 18 is preferably comprised of a highly conductive tubing, or another metal structure, to enable it to act as a Faraday shield between inductor 40 and plasma chamber 26. Further, because shield 18 is placed within plasma chamber 26, directly beneath dielectric window 16, it serves as a structural support therefor. Since plasma chamber 26 is evacuated to a substantial vacuum, during operation, dielectric window 16 is subjected to a pressure differential thereacross which approximates atmospheric pressure. The presence of shield 18, acting as a structural support, enables a substantially thinner dielectric window 16 to be utilized than would be otherwise required. Accordingly, the lesser thickness of dielectric window 16 presents less attenuation to the RF energy that is coupled therethrough by inductor 40 (e.g., less than about 0.75 inches).

Figure 3C:
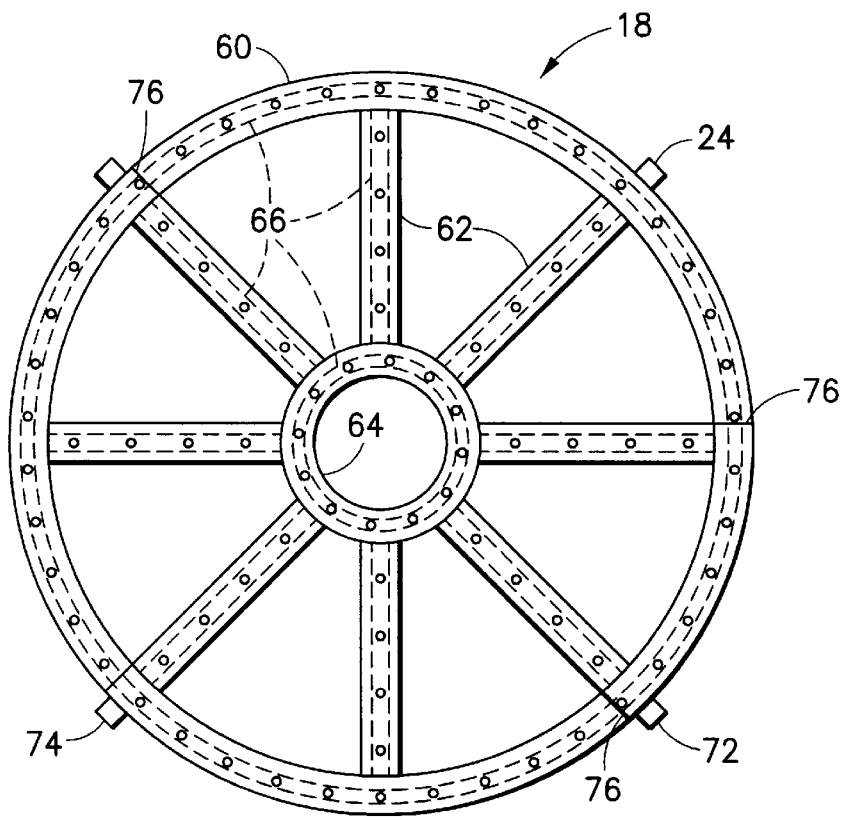
FIG. 3c illustrates a plan view of a support/Faraday shield/gas distributor which enables introduction of plural gases into the ICP reactor of FIG. 1.

As shown in FIG. 3c, shield 18 may also be configured to provide plural different gas supplies via gas inlets 24, 72, 74, etc. In such case, channels that are coupled to one gas inlet (e.g., 24) are separated, by interior walls 76 from channels which communicate with another gas inlet (e.g., 72).

Figure 4:
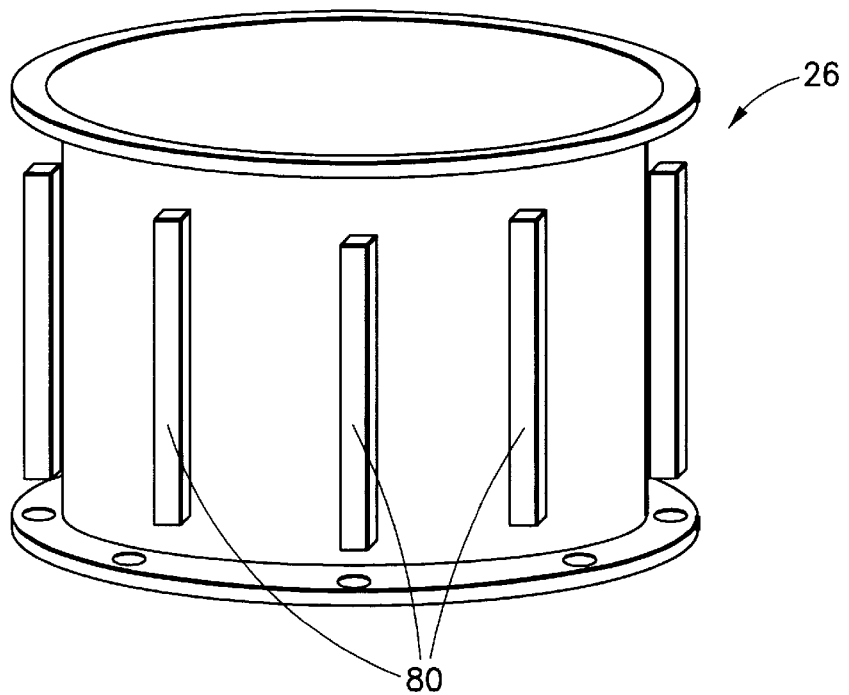
FIG. 4 illustrates a perspective view of the ICP reactor housing showing multiple magnets for plasma confinement positioned about its exterior.

FIG. 4 provides a perspective view of the external surface of plasma chamber 26 and shows the placement of a plurality of permanent magnets 80 which provide plasm-confining magnetic fields within plasma chamber 26.

As can be seen from the above description, the provision of (i) an inductor structure which provides both variable pitch distances and pitch angles between windings, and is configured as a truncated cone, lends an ability to adjust the field within plasma chamber 26 in such a manner as to render the plasma uniform across variable size workpieces. Further, the provision of shield 18 which supports dielectric window 16 while concurrently acting as a gas supply for plasma chamber 26 enables the use of a thinner dielectric window and, accordingly, less attenuation of the electromagnetic energy induced into plasma chamber 26.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

I claim:

1. A plasma reactor, comprising:

a plasma chamber;

gas inlet means for introducing an ionizable gas into said plasma chamber;

support means for positioning a workpiece in said plasma chamber;

a dielectric plate positioned in opposed relationship to said support means and covering an opening in said plasma chamber;

an electrostatic shield positioned within said plasma chamber and in contact with said dielectric plate for providing both a physical support to said dielectric plate and for serving as an electrostatic shield;

an inductor juxtapositioned to said dielectric plate and outside said plasma chamber, said inductor comprising multiple winding portions which evidence plural segments of increasing radii from a center of said inductor, segments of lesser radii respectively arranged to reside further away from said dielectric plate than segments of greater radii;

means for applying a radio frequency (RF) signal to said inductor so as to cause in inductive coupling of RF energy into said plasma chamber through said dielectric plate and a creation of a plasma therein from said ionizable gas.

2. A plasma reactor, comprising:

a plasma chamber;

gas inlet means for introducing an ionizable gas into said plasma chamber;

support means for positioning a workpiece in said plasma chamber;

a dielectric plate positioned in opposed relationship to said support means and covering an opening in said plasma chamber;

an electrostatic shield positioned within said plasma chamber and between said support means and said dielectric plate;

an inductor juxtapositioned to said dielectric plate, said inductor comprising multiple winding portions which evidence plural segments of increasing radii from a center of said inductor, segments of lesser radii respectively arranged to reside further away from said dielectric plate than segments of greater radii;

means for applying a radio frequency (RF) signal to said inductor so as to cause in inductive coupling of RF energy into said plasma chamber through said dielectric plate and a creation of a plasma therein from said ionizable gas; and wherein said gas inlet means comprises channel means positioned within said electrostatic shield and having outlet orifices opening into said plasma chamber, said channel means for receiving said ionizable gas and for passing said gas into said plasma chamber through said orifices; and wherein said channel means comprises plural channels, each channel coupled to a different gas inlet and having outlet orifices opening into said plasma chamber for feeding different gases into said plasma chamber through said orifices.

3. A plasma reactor, comprising:

a plasma chamber;

gas inlet means for introducing an ionizable gas into said plasma chamber;

support means for positioning a workpiece in said plasma chamber;

a dielectric plate positioned in opposed relationship to said support means and covering an opening in said plasma chamber;

an electrostatic shield positioned within said plasma chamber and between said support means and said dielectric plate, said electrostatic shield in contact with said dielectric plate and operating as a physical support therefor;

an inductor, configured as a spiral conductor, juxtapositioned to said dielectric plate, said inductor comprising multiple winding portions which evidence plural segments of increasing radii from a center of said inductor, segments of lesser radii respectively arranged to reside further away from said dielectric plate than segments of greater radii;

means for applying a radio frequency (RF) signal to said inductor so as to cause in inductive coupling of RF energy into said plasma chamber through said dielectric plate and a creation of a plasma therein from said ionizable gas.

4. The plasma reactor as recited in claim 1, wherein said gas inlet means comprises:

channel means positioned within said electrostatic shield and having outlet orifices opening into said plasma chamber, said channel means for receiving said ionizable gas and for passing said gas into said plasma chamber through said orifices.

5. The plasma reactor as recited in claim 3, wherein said channel means comprises plural channels, each channel coupled to a different gas inlet and having outlet orifices opening into said plasma chamber for feeding different gases into said plasma chamber through said orifices.

6. The plasma reactor as recited in claim 1, wherein said channel means is configured as a circumferential wheel, a hub and plural spokes connecting said wheel and said hub, said wheel, hub and plural spokes including said channel means and said outlet orifices.

7. The plasma reactor as recited in claim 1, wherein said inductor is configured as a spiral conductor.

8. The plasma reactor as recited in claim 1, wherein said inductor is configured from a strap of conductive metal, said strap having a width that is greater than its thickness, said strap positioned so that its thickness aspect is parallel to a major surface of said dielectric plate.

9. The plasma reactor as recited in claim 1, wherein said dielectric plate evidences a thickness that is less than about 0.75 inches.

* * * * *